(12) United States Patent
Taniguchi et al.

(10) Patent No.: US 8,664,685 B2
(45) Date of Patent: *Mar. 4, 2014

(54) RESIN COMPOSITION FOR OPTICAL SEMICONDUCTOR ELEMENT HOUSING PACKAGE, AND OPTICAL SEMICONDUCTOR LIGHT-EMITTING DEVICE OBTAINED USING THE SAME

(75) Inventors: Takashi Taniguchi, Osaka (JP); Takamitsu Ota, Osaka (JP); Hisataka Ito, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/875,417

(22) Filed: Sep. 3, 2010

(65) Prior Publication Data

US 2011/0057228 A1 Mar. 10, 2011

(30) Foreign Application Priority Data

Sep. 7, 2009 (JP) .................................. 2009-205753

(51) Int. Cl.
*H01L 33/52* (2010.01)
*C08L 63/00* (2006.01)
*C08K 3/22* (2006.01)

(52) U.S. Cl.
USPC ........ 257/99; 257/40; 257/E33.059; 524/413; 524/612

(58) Field of Classification Search
USPC ............... 257/40, 99, E33.059; 524/413, 612
See application file for complete search history.

(56) References Cited

U.S. PATENT DOCUMENTS

| | | | |
|---|---|---|---|
| 2002/0132108 A1 | 9/2002 | Ikegawa et al. | |
| 2003/0021917 A1* | 1/2003 | Hotaka et al. | 428/29 |
| 2004/0034152 A1* | 2/2004 | Oka et al. | 524/497 |
| 2006/0243947 A1 | 11/2006 | Tsumura et al. | |
| 2009/0134411 A1* | 5/2009 | Kitani et al. | 257/98 |
| 2009/0141504 A1 | 6/2009 | Ushiki et al. | |
| 2009/0261374 A1* | 10/2009 | Hayashi | 257/99 |
| 2010/0059782 A1 | 3/2010 | Fujitomo et al. | |
| 2010/0140638 A1* | 6/2010 | Kotani et al. | 257/98 |
| 2010/0155739 A1 | 6/2010 | Kuramoto et al. | |

(Continued)

FOREIGN PATENT DOCUMENTS

| | | |
|---|---|---|
| CN | 1 011 61 721 A | 4/2008 |
| CN | 101673796 A | 3/2010 |

(Continued)

OTHER PUBLICATIONS

Communication, dated Jan. 29, 2012, issued by the State Intellectual Property Office of P.R. China in corresponding Chinese Application No. 201010275948.X.

(Continued)

*Primary Examiner* — Whitney T Moore
(74) *Attorney, Agent, or Firm* — Sughrue Mion, PLLC

(57) ABSTRACT

The present invention relates to a resin composition for forming an insulating resin layer for optical semiconductor element housing package having a concave portion in which a metal lead frame and an optical semiconductor element mounted thereon are housed, in which the resin composition includes the following ingredients (A) to (D), and the ingredients (C) and (D) are contained in a blend ratio (C)/(D) of 0.3 to 3.0 as a weight ratio thereof: (A) an epoxy resin; (B) an acid anhydride curing agent; (C) a white pigment; and (D) an inorganic filler.

3 Claims, 1 Drawing Sheet

(56) References Cited

U.S. PATENT DOCUMENTS

| | | | |
|---|---|---|---|
| 2010/0164362 | A1 | 7/2010 | Miyakawa et al. |
| 2010/0256271 | A1* | 10/2010 | Hasegawa et al. ............ 524/204 |
| 2010/0279091 | A1* | 11/2010 | Nishida et al. ................ 428/213 |
| 2011/0012146 | A1* | 1/2011 | Hitsuda et al. ................. 257/94 |

FOREIGN PATENT DOCUMENTS

| | | | |
|---|---|---|---|
| JP | 10-202789 | A | 8/1998 |
| JP | 2002-283498 | A | 10/2002 |
| JP | 2002-294070 | | 10/2002 |
| JP | 2004-18554 | A | 1/2004 |
| JP | 2004-288937 | A | 10/2004 |
| JP | 2004-339319 | A | 12/2004 |
| JP | 2006-140207 | A | 6/2006 |
| JP | 2007-138016 | A | 6/2007 |
| JP | 2008-106226 | A | 5/2008 |
| JP | 2008-306151 | A | 12/2008 |
| JP | 2009-149878 | A | 7/2009 |
| JP | 2011-9519 | A | 1/2011 |
| WO | 2004/076585 | A1 | 9/2004 |
| WO | 2007/015426 | A1 | 2/2007 |
| WO | 2008/111504 | A1 | 9/2008 |
| WO | 2008/143076 | A1 | 11/2008 |

OTHER PUBLICATIONS

Communication issued Jul. 12, 2012 by the State Intellectual Property Office of the People's Republic of China in counterpart Chinese Application No. 201010275948.X.

Communication dated Apr. 6, 2012 issued by the Japanese Patent Office in corresponding Japanese Application No. 2009-205753.

Communication dated Oct. 30, 2012 issued by the State Intellectual Property Office of PR China in counterpart Chinese Patent Application No. 201010275948.X.

Office Action dated Mar. 29, 2013 issued by the State Intellectual Property Office of the People's Republic of China in counterpart Chinese Patent Application No. 201010275948.

Office Action dated Mar. 12, 2013 issued by the Japanese Patent Office in counterpart Japanese Patent Application No. 2009-205753.

Non-Final Office Action issued in U.S. Appl. No. 13/403,422, dated Jan. 15, 2013.

Non-Final Office Action issued in U.S. Appl. No. 13/403,422, dated Jul. 1, 2013.

Office Action, dated Aug. 22, 2013, issued by the State Intellectual Property Office of P.R. China in counterpart Chinese Patent Application No. 201010275948.X.

Office Action, dated Nov. 26, 2013, issued by the State Intellectual Property Office of the People's Republic of China, in counterpart Application No. 201010275948.

Office Action, dated Dec. 27, 2013, issued by the U.S. Patent Office in U.S. Appl. No. 13/403,422.

* cited by examiner

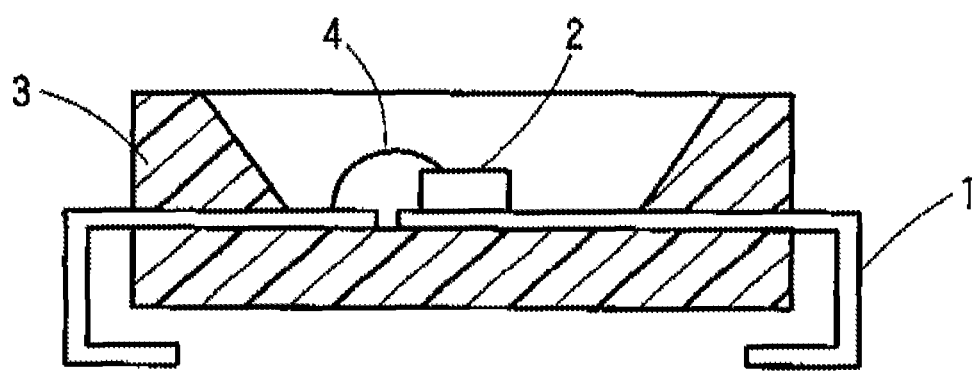

RESIN COMPOSITION FOR OPTICAL SEMICONDUCTOR ELEMENT HOUSING PACKAGE, AND OPTICAL SEMICONDUCTOR LIGHT-EMITTING DEVICE OBTAINED USING THE SAME

FIELD OF THE INVENTION

The present invention relates to a resin composition for optical semiconductor element housing package, which is to be an insulating resin layer forming material to be formed around a light-emitting element and which reflects the light emitted by the light-emitting element to provide directivity, and relates to an optical semiconductor light-emitting device obtained by using the same.

BACKGROUND OF THE INVENTION

Heretofore, an optical semiconductor light-emitting device with a light-emitting element mounted therein is so planned that an optical semiconductor element 2 is mounted on a metal lead frame 1, and an insulating resin layer 3 is formed to surround the optical semiconductor element 2 except the upper side thereof, as shown in FIG. 1. In FIG. 1, 4 is a bonding wire that electrically connects the electrode circuit (not shown) formed on the metal lead frame 1 to the optical semiconductor element 2.

In such an optical semiconductor light-emitting device, the insulating resin layer 3 is formed of a thermoplastic resin such as typically polyphthalamide resin (PPA) or the like through injection molding. A white pigment is generally incorporated into the thermoplastic resin to reflect the light emitted by the optical semiconductor element 2 and impart directivity thereto (see Patent Document 1).

In case where high heat resistance is required, a ceramic material containing sintered alumina is mainly used to form a part in place of the insulating resin layer 3 (see Patent Document 2). However, the formation of the part corresponding to the insulating resin layer 3 from the ceramic material is problematic in view of the suitability for mass production and cost of such packages, etc, and further, the shape reproducibility of the reflector (reflective part).

Given the situation, recently, for solving the problems, the mainstream in producing optical semiconductor light-emitting devices is going to be transfer molding with a thermosetting resin. The thermosetting resin forming material for use in production through transfer molding is generally an epoxy resin composition including a combination of an epoxy resin such as a bisphenol A epoxy resin or the like and a curing agent such as an acid anhydride or the like, since the surface of the cured material thereof is required to have high-level light reflectivity.

In that situation, recently, the brightness of light-emitting devices is being elevated further, and a material having higher heat resistance and light resistance than before is desired for the resin composition for use for optical semiconductor light-emitting devices. For example, as a method for enhancing the heat resistance and the light resistance of the resin composition for use for optical semiconductor light-emitting devices, an alicyclic epoxy resin is used for light absorption to suppress light degradation, and this is employed in some quarters (see Patent Document 3).

Patent Document 1: JP-A-2002-283498
Patent Document 2: JP-A-2004-288937
Patent Document JP-A-2004-339319

SUMMARY OF THE INVENTION

However, the resin composition including an alicyclic epoxy resin as above could not as yet attain sufficient characteristics since the reflector material of the composition could hardly filled up highly and since the moldability of the resin composition is poor as producing burr; and therefore still now, the insulating resin layer 3 is generally formed of the above-mentioned thermoplastic resin, as so mentioned in the above.

However, use of thermoplastic resin as the forming material for the insulating resin layer 3 involves some problems as follows: Specifically, these days, surface mounting packages such as the above-mentioned optical semiconductor light-emitting device are required to have heat resistance owing to the influence of lead-free technology thereon. Accordingly, despite the requirement for thermal deformation resistance at a high solder-mounting temperature, and for further long-term heat resistance of the power-elevated and brightness-increased optical semiconductor element 2, there occurs a problem of discoloration of the element at high temperature, and with that, there occur other problems of reduction in the light reflection efficiency and reduction in the adhesiveness to the encapsulation resin material used in encapsulating the upper part of the optical semiconductor element 2.

From these viewpoints, a technique is strongly desired that can solve the problem of long-term high-temperature heat resistance of thermoplastic resin and the problem of mass producibility of ceramic material.

The present invention has been made in consideration of the situation as above, and an object thereof is to provide a resin composition for optical semiconductor element housing package excellent in long-term high-temperature heat resistance and capable of imparting good light reflectivity, and to provide an optical semiconductor light-emitting device produced with the resin composition and excellent in mass producibility and cost performance.

Namely, the present invention relates to the following items (1) to (5).

(1) A resin composition for forming an insulating resin layer for optical semiconductor element housing package having a concave portion in which a metal lead frame and an optical semiconductor element mounted thereon are housed, in which the resin composition include the following ingredients (A) to (D), and the ingredients (C) and (D) are contained in a blend ratio by weight (C)/(D) of 0.3 to 3.0:

(A) an epoxy resin;
(B) an acid anhydride curing agent;
(C) a white pigment; and
(D) an inorganic filler.

(2) The resin composition according to item (1), in which the ingredient (C) is titanium oxide.

(3) The resin composition according to item (2), in which the titanium oxide has a rutile-form crystal structure, (4) The resin composition according to any one of items (1) to (3), in which the ingredients (C) and (D) are contained in a total content of 10 to 90% by weight based on a whole resin composition.

(5) An optical semiconductor light-emitting device including: an insulating resin layer; a concave portion formed in the insulating resin layer; a metal lead frame arranged inside the concave portion; and an optical semiconductor element arranged on the metal lead frame, in which the insulating resin layer is formed of the resin composition for optical semiconductor element housing package according to any one of items (1) to (4), Specifically, the present inventors have made assiduous studies for obtaining a resin composition for optical semiconductor element housing package which is protected from discoloration by heat and which is excellent in tong-term high-temperature heat resistance. As a result, the inventors have found that when use of epoxy resin that is thermosetting resin, is combined with additional use of a white pigment and an inorganic filler and when the blend ratio by weight of the two is defined to fall within a specific range, then the characteristics of the two are synergistically exhibited, and owing to the synergistic effect, the resin composition can maintain long-term, high heat-resistant discoloration capability, and in addition, owing to the use of the epoxy resin therein, the resin composition enables encapsulation in a mold through transfer molding therein, and accordingly, the resin composition is advantageous from the viewpoint of mass producibility and can therefore attain the intended object. Based on these findings, the inventors have reached the present invention.

As in the above, the invention provides a resin composition for an insulating resin layer for optical semiconductor element housing package having a concave portion in which a metal lead frame and an optical semiconductor element mounted thereon are housed, in which the insulating resin layer forming material includes a resin composition containing an epoxy resin [ingredient (A)], an acid anhydride curing agent [ingredient (B)], a white pigment [ingredient (C)] and an inorganic filler [ingredient (D)], and in which the blend ratio of the white pigment to the inorganic filler [(C)/D)] is defined to fall within a range of from 0.3 to 3.0 as a weight ratio thereof. Accordingly, the resin composition is excellent in solder heat resistance and long-terra high-temperature heat resistance, and exhibits excellent capability of light degradation resistance, and therefore realizes good light reflectivity. Accordingly, the optical semiconductor light-emitting device in which the insulating resin layer is formed of the resin composition is given good light directivity, therefore capable of emitting stable light and sufficiently exhibiting its function.

When titanium oxide is used as the white pigment [ingredient (C)], then it realizes a high degree of whiteness and excellent light reflectivity of the insulating resin layer owing to good dispersibility and chemical stability thereof.

When titanium oxide having a ruffle-form crystal structure is used, then it augments further excellent long-term high-temperature heat resistance of the insulating resin layer.

When the total content of the white pigment [ingredient (C)] and the inorganic filler [ingredient (D)] is within a range of 10 to 90% by weight based on a whole resin composition, then the linear expansion coefficient of the insulation resin layer may be reduced and the resin composition realizes good flowability.

BRIEF DESCRIPTION OF THE DRAWING

FIG. 1 is a cross-sectional view graphically showing the constitution of an optical semiconductor light-emitting device.

DETAILED DESCRIPTION OF THE INVENTION

The resin composition for optical semiconductor element housing package of the invention (this may be herein referred to as "resin composition") is used as a material for forming the insulating resin layer 3 in the optical semiconductor light-emitting device shown in FIG. 1, as so described in the above; and this includes an epoxy resin (ingredient A), an acid anhydride curing agent (ingredient B), a white pigment (ingredient C) and an inorganic filler (ingredient D). In general, the resin composition is liquid, powdery or in the form of tablets prepared by tabletting the powder, and is used for encapsulation.

Examples of the epoxy resin (ingredient A) include novolak epoxy resins such as bisphenol A epoxy resins, bisphenol F epoxy resins, phenol-novolak epoxy resins, cresol-novolak epoxy resins, etc.; alicyclic epoxy resins; nitrogen-containing cyclic epoxy resins such as triglycidyl isocyanurate, hydantoin epoxy resins, etc.; biphenyl epoxy resins that are the mainstream of cured materials of low water absorption, such as hydrogenated bisphenol A epoxy resins, aliphatic epoxy resins, glycidyl ether epoxy resins, bisphenol S epoxy resins, etc.; dicyclo cyclic epoxy resins and naphthalene epoxy resins. These may be used here either singly or as combined. Of those epoxy resins, preferred is single use or combined use of alicyclic epoxy resins and triglycidyl isocyanurate from the viewpoint of excellent transparency and discoloration resistance.

The epoxy resin (ingredient A) may be solid or liquid at room temperature, but in general, the average epoxy equivalent of the epoxy resin for use herein is preferably from 90 to 1000 g/eq. In case where the epoxy resin is solid, its softening point is preferably 160° C. or lower. This is because, when the epoxy equivalent is too small, then the cured material of the resin composition may be brittle, and when the epoxy equivalent is too large, then glass transition temperature (Tg) of the cured material of the resin composition tends to be low.

Examples of the acid anhydride curing agent (ingredient B) include phthalic anhydride, maleic anhydride, trimellitic anhydride, pyromellitic anhydride, hexahydrophthalic anhydride, tetrahydrophthalic anhydride, methylnadic anhydride, nadir anhydride, glutaric anhydride, methylhexahydrophthalic anhydride and methyltetrahydrophthalic anhydride. These may be used here either singly or as combined. Of those acid anhydride curing agents, preferred is use of phthalic anhydride, hexahydrophthalic anhydride, tetrahydrophthalic anhydride, methylhexahydrophthalic anhydride. More preferably, the acid anhydride curing agent (ingredient B) has a molecular weight of from 140 to 200 or so, and also preferred is a colorless or light-yellow acid anhydride curing agent.

The blend ratio of the epoxy resin (ingredient A) to the acid anhydride curing agent (ingredient B) is preferably so defined that the active group (acid anhydride group or hydroxyl group) capable of reacting with the epoxy group in the acid anhydride curing agent (ingredient B) could be from 0.5 to 1.5 equivalents relative to 1 equivalent of the epoxy group in the epoxy resin (ingredient A), more preferably from 0.7 to 1.2 equivalents. This is because, when the amount of the active group is too small, then the curing rate of the resin composition may be low and the glass transition temperature (TO of the cured material thereof tends to be low; but when the amount of the active group is too large, then the moisture resistance of the resin composition tends to lower.

As the acid anhydride curing agent (ingredient B), any other curing agent for epoxy resin than the acid anhydride curing agent, for example, a phenolic curing agent, an amine curing agent, a partial ester of the acid anhydride curing agent partially esterified with an alcohol, or a carboxylic acid curing agent such as hexahydrophthalic acid, tetrahydrophthalic acid, methylhexahydrophthalic acid or the like, may be used either singly or as combined with the above-mentioned acid anhydride curing agent and phenolic curing agent, depending on the purpose and the use thereof. For example, in the case where a carboxylic add curing agent is used as combined, it may accelerate the curing rate, and may enhance the producibility. When those curing agents are used, the blend ratio thereof may be conformed to the blend ratio (equivalent ratio) in the ease of using the above-mentioned acid anhydride curing agent.

Examples of the white pigment (ingredient C) to be in the resin composition along with the above-mentioned ingredient A and ingredient B, include an inorganic white pigment such as titanium oxide, zinc oxide, lead white, kaolin, calcium carbonate, zirconium oxide. One or more of these may be used here either singly or as combined. Of those, preferred is use of titanium oxide having various good characteristics of excellent whiteness, large light reflectivity, good masking power and coloring power, high dispersibility, excellent weather resistance and extremely excellent chemical stability. In particular, from the viewpoint of its ability to maintain high light reflectivity at around a wavelength of 450 nm when exposed to high temperature for a long period of time, more preferred is single use of titanium oxide having a rutile-form crystal structure, or combined use thereof with titanium oxide having an, anatase-form crystal mixture where the blend ratio of the rutile-form titanium oxide is higher. In the combined system, preferably, the amount of the anatase-form titanium oxide is on a level of impurity, or that is, it is desirable that the combined system could be substantially a single system of rutile-form titanium oxide. Of those, more preferred is use of titanium oxide having an average particle size of from 0.05 to 1.0 μm from the viewpoint of the flowability and the light shieldability thereof. Even more preferred is use of titanium oxide having an average particle size of from 0.08 to 0.5 μm from the viewpoint of the light reflectivity thereof. The average particle size can be measured using a laser diffraction/scattering type particle size distribution analyzer.

Preferably, the content of the white pigment (ingredient C) is defined to fall within a range of from 5 to 90% by weight of the whole resin composition, but from the viewpoint of the colorability and the reflectivity thereof, the content is more preferably within a range of from 10 to 60% by weight of the whole resin composition. This is because, when the content of the ingredient C is too small, then the degree of whiteness itself may lower and the reflectivity may be thereby lowered; but when the content of the ingredient C is too large, then the surface of the insulating resin layer could hardly be smooth and the reflectivity may tend to be thereby lowered.

Examples of the inorganic filler (ingredient D) to be in the resin composition along with the above-mentioned ingredients A to C, include silica powder such as quartz glass powder, talc, silica powders such as a powder of fused silica and a powder of crystalline silica, alumina powder, aluminium nitride powder and silicon nitride powder. Above all, preferred is use of silica powder from the viewpoint of reducing the linear expansion coefficient of the insulating resin layer; and especially from the viewpoint of the high packing capability and high flowability thereof, more preferred is use of spherical fused silica powder. Even more preferred is use of the powder having an average particle size of from 5 to 60 μm, still more preferably having an average particle size of from 15 to 45 μm. The average particle size can be measured using a laser diffraction/scattering type particle size distribution analyzer.

The content of the inorganic filler (ingredient D) is preferably so defined that the total content of the white pigment (ingredient C) and the inorganic filler could be from 5 to 90% by weight based on the whole resin composition, more preferably from the viewpoint of reducing the linear expansion coefficient of the resin layer and securing the flowability of the resin composition, the total content thereof could be from 10 to 80% by weight.

The blend ratio of the white pigment (ingredient C) to the inorganic filler (ingredient D) [ingredient C/ingredient D] must be so defined that the ratio by weight of ingredient C/ingredient D falls within a range of from 0.3 to 3.0. Especially preferably, from the viewpoint of the dispersibility, the ratio of ingredient C/ingredient D is defined to fall within a range of from 0.5 to 2.0. This is because, when the blend ratio oversteps the above range and when the ratio of ingredient C/ingredient D is too small, then the long-term, high-temperature heat resistance of the resin layer may lower, but on the contrary when the ratio of ingredient C/ingredient D is too large, then the flowability may lower and the resin composition may be difficult to shape through transfer molding, and finally this may have negative influence on the reflectivity of the insulating resin layer such that the smoothness of the cured material may be poor.

In addition to the above-mentioned ingredients A to D, if desired, various additives may be incorporated in the resin composition of the invention, such as curing accelerator, antioxidant, modifier, defoaming agent, leveling agent, release agent, etc.

Examples of the curing accelerator include tertiary amines such as 1,8-diazabicyclo[5.4.0]undecane-7, triethylenediamine, tri-2,4,6-dimethylaminomethylphenol, N,N-dimethylbenzylamine, N,N-dimethylaminobenzene, and N,N-dimethylaminocyclohexane, imidazole compounds such as 2-ethyl-4-methylimidazole and 2-methylimidazole, phosphorus compounds such as triphenylphosphine, tetraphenylphosphonium tetraphenylborate, and tetra-n-butylphosphonium o,o-diethyl phosphorodithioate, quaternary ammonium salts, organic metal salts, and derivatives thereof. These may be used alone or in combination of two or more thereof. Preferred of these curing accelerators are tertiary amines, imidazole compounds, and phosphorus compounds. It is especially preferred to use phosphorus compounds, among these curing accelerators, in order to obtain a cured material which has a low degree of coloration and is transparent and tough.

The content of the curing accelerator is preferably defined to be from 0.01 to 8.0% by weight relative to the epoxy resin (ingredient A), more preferably from 0.1 to 3.0% by weight. This is because, when the content of the curing accelerator is too small, then the resin could not obtain a sufficient curing promoting effect, but when the content of the curing accelerator is too large, the cured material to be obtained may tend to be discolored.

Examples of the antioxidant include antioxidants of phenolic compounds, amine compounds, organic sulfur compounds and phosphine compounds. Examples of the modifier include conventionally known modifiers such as glycols, silicones, and alcohols. Examples of the defoaming agent include conventionally known defoaming agents such as silicones.

The resin composition of the invention may be produced, for example, as follows: briefly, the ingredients A to D and various optional additives are suitably blended, kneaded and melt-mixed with a kneader, and then this is cooled to room temperature and ground to give a fine powdery resin composition.

The cured material of the resin composition thus obtained as in the above preferably has a light reflectivity at a wavelength of from 430 to 1300 nm of at least 80%, more preferably at least 90%, even more preferably at least 94%. The uppermost limit of the light reflectivity is 100%. The light reflectivity is measured, for example, in the following manner. A 1 mm-thick cured material of the resin composition is produced under a predetermined curing conditions, for example, molding at 150° C. for 4 minutes and subsequent curing at 150° C. for 3 hours. The reflectivity of this cured material at that wavelength can be measured with a spectrophotometer (e.g., Spectrophotometer V-670 manufactured by JASCO Corp.) at room temperature (25±10° C.).

The optical semiconductor light-emitting device obtained using the resin composition of the invention can be produced as follows: briefly, a metal lead frame with an optical semiconductor element mounted thereon is prepared, this is set in the mold, of a transfer molding machine, and the above-mentioned resin composition is transfer-molded therein to form an insulating resin layer. In that manner, as shown in FIG. 1, an optical semiconductor light-emitting device unit is produced, including the insulating resin layer 3, the concave portion formed in the insulating resin layer 3, the metal lead frame 1 arranged inside the concave portion, and the optical semiconductor element 2 mounted on the metal lead frame 1.

The concave portion space surrounded by the insulating resin layer 3 above the optical semiconductor element 2 mounted on the metal lead frame 1 is further filled with a transparent resin and encapsulated with it. The transparent resin may be, for example, a transparent epoxy resin or the like conventionally used in the art. Accordingly, the intended optical semiconductor light-emitting device is produced.

EXAMPLES

Examples and Comparative Examples are described below. However, the invention should not be limited to these Examples.

Constitutive ingredients mentioned below were first prepared prior to producing a resin composition.

Epoxy Resin: 1,3,5-Trisglycidylisocyanuric acid (average epoxy equivalent: 100 g/eq, melting point: 100° C.).

Acid Anhydride: Methylhexahydrophthalic anhydride (acid equivalent 168 g/eq).

Titanium Oxide a: Rutile-form having a mean particle size of 0.21 μm.

Titanium Oxide b: Anatase-form having a mean particle size of 0.18 μm.

Silica Powder Spherical fused silica having an average particle size of 23 μm.

Antioxidant: 9,10-Dihydro-9-oxa-10-phosphaphenanthrene-10-oxide.

Curing Accelerator: Tetra-n-butylphosphonium o,o-diethyl phosphorodithioate.

Examples 1 to 5, Reference Examples 1 and 2, Comparative Examples 1 and 2

The ingredients shown in Table 1 below were blended in the ratio shown therein, then melt-mixed in a beaker, aged, then cooled to room temperature and ground to prepare the intended fine powdery epoxy resin composition.

Thus produced, the epoxy resin compositions of Examples and Comparative Examples were analyzed to measure the reflectivity thereof (initial stage, after left long at high temperature). The results are shown in Table 1 below.

Reflectivity

The epoxy resin composition was formed into a test piece having a thickness of 1 mm under a predetermined curing condition (condition: shaping at 150° C. for 4 minutes+curing at 150° C. for 3 hours); and the total reflectivity of the test piece (cured material) was measured in the initial stage and after left at 150° C. for 168 hours. As the tester, used was Spectrophotometer V-670 manufactured by JASCO Corp. The light reflectivity at a wavelength of 450 nm of each sample was measured at room temperature (25° C.).

TABLE 1

| | | Example | | | | | Reference Example | | Comparative Example (part by weight) | |
|---|---|---|---|---|---|---|---|---|---|---|
| | | 1 | 2 | 3 | 4 | 5 | 1 | 2 | 1 | 2 |
| Epoxy Resin | | 100 | 100 | 100 | 100 | 100 | 100 | 100 | 100 | 100 |
| Acid Anhydride | | 152 | 152 | 152 | 152 | 152 | 152 | 152 | 152 | 152 |
| Titanium Oxide a (rutile-form) | | 100 | 150 | 200 | 70 | 225 | — | — | 60 | 350 |
| Titaninum Oxide b (anatase-form) | | — | — | — | — | — | 200 | 150 | — | — |
| Silica Powder | | 200 | 150 | 100 | 230 | 75 | 100 | 150 | 240 | 100 |
| Antioxidant | | 4 | 4 | 4 | 4 | 4 | 4 | 4 | 4 | 4 |
| Curing Accelerator | | 2.0 | 2.0 | 2.0 | 2.0 | 2.0 | 2.0 | 2.0 | 2.0 | 2.0 |
| Blend ratio by weight of titanium oxide to silica powder* | | 0.5 | 1.0 | 2.0 | 0.3 | 3.0 | 2.0 | 1.0 | 0.25 | 3.5 |
| Reflectivity (%) | initial stage | 95 | 96 | 95 | 90 | 92 | 91 | 91 | 83 | 89 |
| | 150° C. × 168 hrs | 91 | 92 | 91 | 88 | 91 | 84 | 83 | 80 | 87 |

*Calculated as [amount of titanium oxide]/[amount of silica powder].

From the above results, it is seen that the samples of Examples all had high data of reflectivity both in the initial stage and after left at high temperature for a long period of time, and are therefore excellent in long-term high-temperature heat resistance.

As opposed to these, the samples of Reference Examples 1 and 2 in which the blend ratio by weight of titanium oxide to silica powder falls within the specific range but the titanium oxide is not a rutile-form one but is an anatase-form one could have an initial reflectivity of more than 90%, but the reflectivity thereof after left at high temperature for a long period of time was low. Regarding the samples of Comparative Examples 1 and 2 in which rutile-form titanium oxide was used but the blend ratio by weight of titanium oxide to silica powder fell outside the specific range, the reflectivity thereof in the initial stage and after left at high temperature for a long period of time was all low, or that is, the heat resistance including long-term high-temperature heat resistance of the comparative samples was poor.

Using the fine powdery epoxy resin composition of the sample of the above Examples, an optical semiconductor light-emitting device having the constitution shown in FIG. 1 was produced. Briefly, an optical semiconductor element (size: 0.3 mm×0.3 mm) 2 was mounted on a 42-alloy (Ag plated) lead frame 1 and the electrode circuit and the optical semiconductor element 2 formed on the metal lead frame 1 were electrically connected to each other with a bonding wire 4. Thus prepared, the optical semiconductor light-emitting device was put into a transfer molding machine, and was transfer-molded therein to produce the intended optical semiconductor light-emitting device unit including the insulating resin layer 3, the concave portion formed in the insulating resin layer 3, the metal lead frame arranged inside the concave portion and the optical semiconductor element 2 mounted on the metal lead frame 1, as shown in FIG. 1 (molding condition: molding at 150° C.×4 minutes+curing at 150° C.×3 hours). Thus obtained, the optical semiconductor light-emitting device was good with no problem.

While the invention has been described in detail with reference to specific embodiments thereof, it will be apparent to one skilled in the art that various changes and modifications can be made therein without departing from the spirit and scope thereof.

Incidentally, the present application is based on Japanese Patent Application No 2009-205753 filed on Sep. 7, 2009, and the contents are incorporated herein by reference.

All references cited herein are incorporated by reference herein in their entirety.

The resin composition for optical semiconductor element housing package of the invention is useful as an insulating resin layer forming material which is formed around a light-emitting element to surround it and which reflects the light emitted by the light-emitting element mounted in an optical semiconductor light-emitting device to provide directivity.

| Description of Reference Numerals and Sips | |
|---|---|
| 1 | Metal Lead Frame |
| 2 | Optical Semiconductor Element |
| 3 | Insulating Resin Layer |

What is claimed is:

1. A resin composition for forming an insulating resin layer for optical semiconductor element housing package having a concave portion in which a metal lead frame and an optical semiconductor element mounted thereon are housed, wherein the resin composition comprises the following ingredients (A) to (E), and the ingredients (C) and (D) are contained in a blend ratio by weight (C)/(D) of 0.3 to 0.5:
    (A) an epoxy resin;
    (B) an acid anhydride curing agent;
    (C) titanium oxide having a rutile-form crystal structure;
    (D) an inorganic filler, and
    (E) a curing accelerator comprising a phosphorus compound,
    wherein the epoxy resin is triglycidylisocyanurate.

2. The resin composition according to claim 1, wherein the ingredients (C) and (D) are contained in a total content of 10 to 90% by weight based on a whole resin composition.

3. An optical semiconductor light-emitting device comprising: an insulating resin layer; a concave portion formed in the insulating resin layer; a metal lead frame arranged inside the concave portion; and an optical semiconductor element arranged on the metal lead frame, wherein the insulating resin layer is fanned of the resin composition for optical semiconductor element housing package according to claim 1.

* * * * *